United States Patent [19]

Robinson

[11] Patent Number: 5,532,945

[45] Date of Patent: Jul. 2, 1996

[54] POWER BUDGETTING IN A COMPUTER SYSTEM HAVING REMOVABLE DEVICES

[75] Inventor: Kurt B. Robinson, Newcastle, Calif.

[73] Assignee: Intel Corporation, Santa Clara, Calif.

[21] Appl. No.: 261,447

[22] Filed: Jun. 17, 1994

[51] Int. Cl.⁶ .................. G06F 1/00; G11C 7/00
[52] U.S. Cl. .............. 364/707; 365/226; 365/227; 395/750; 395/442
[58] Field of Search ............... 364/707; 395/425, 395/550, 575, 750; 365/900, 226, 227, 229

[56] References Cited

U.S. PATENT DOCUMENTS

| | | | |
|---|---|---|---|
| 5,251,320 | 10/1993 | Kuzawinski et al. | 364/707 |
| 5,267,218 | 11/1993 | Elbert | 365/226 |
| 5,339,445 | 8/1994 | Gasztonyi | 366/707 |
| 5,345,424 | 9/1994 | Landgraf | 365/227 |
| 5,369,754 | 11/1994 | Fandvich et al. | 395/425 |
| 5,379,401 | 1/1995 | Robinson et al. | 395/425 |
| 5,390,305 | 2/1995 | Chung et al. | 364/707 |
| 5,404,546 | 4/1995 | Stewart | 364/707 |
| 5,410,713 | 4/1995 | White et al. | 364/707 |
| 5,469,399 | 11/1995 | Sato et al. | 365/226 |

*Primary Examiner*—Roy N. Envall, Jr.
*Assistant Examiner*—Emmanuel L. Moise
*Attorney, Agent, or Firm*—Blakely, Sokoloff, Taylor & Zafman

[57] ABSTRACT

A computer system with power budgeting for removable devices is disclosed comprising a nonvolatile memory that contains a power resource table for storing a power consumption indication for at least one resident device for the computer system. The computer system further comprises a removable device that contains a card information structure that stores a power consumption indication for the removable device. A processor executes a power management driver that allocates a power budget to the removable device according to the power resource table and the card information structure. The power management driver updates the power: resource table to indicate the power budget to the removable device.

14 Claims, 6 Drawing Sheets

POWER BUDGETTING IN A COMPUTER SYSTEM HAVING REMOVABLE DEVICES

BACKGROUND OF THE INVENTION

1. Field of the Invention

The present invention pertains to the field of computer systems. More particularly, this invention relates to a method for managing the power consumption of removable devices in a computer system.

2. Background

Recent portable computer systems such as laptop computers and palmtop computers typically contain resident devices such as a keyboard, a display device, and a disk storage device. Typically, such resident devices are devices embedded within the computer system. In addition, such resident devices may include semipermanent devices or devices not intended for regular installation and removal. Resident devices are typically assembled into a computer system during manufacture of the computer system or are installed during a field system upgrade of the computer system.

In addition, some recent portable computer systems provide standardized card slots for accepting removable devices. Such removable devices are designed for regular insertion and removal from the standardized card slots as needed. Such removable devices may include, for example, flash memory cards, rotating mass storage devices, and fax-modem cards. Typically, such removable devices conform to a standardized form factor for the card slots that accept the removable devices. Such a standardized form factor enables a wide variety of devices to be freely inserted and removed from the standardized card slots in the computer system.

Typically, such a portable computer system includes a battery subsystem that provides power to the system including the resident devices and the removable devices. Such a battery subsystem is typically capable of supplying a limited amount of peak electrical current to the system. The amount of electrical current available from such a battery subsystem is usually determined by a maximum electrical current rating for the battery subsystem.

Prior portable computer systems typically allocate fixed levels of power to each of the standardized card slots that accept removable devices. As the user inserts removable devices into the standardized card slots, the electrical current demands on the battery subsystem increases. As a consequence, the insertion of removable devices may cause the power demands on the battery subsystem to exceed the maximum current rating.

The amount of electrical power available to newly inserted removable devices from such battery subsystem usually varies according to the state of the resident devices and the state of the other removable devices in the standardized card slots. For example, the amount of power available to a newly inserted removable device increases if a resident disk subsystem in the computer system is in a sleep state or power down state.

In addition, differing types of removable devices have differing electrical power requirements. For example, a removable fax-modem card typically consumes more electrical power than a removable static random access memory card.

Moreover, the power consumption of a removable device usually varies according to the functional mode of the removable device. For example, a typical removable flash memory card requires more electrical current during flash program and erase operations than during read operations to the flash memory card. In addition, some prior removable flash memory devices are capable of performing multiple concurrent erase operations. In such devices, the electrical power consumption varies according to the number of flash program or erase operations that overlap in time.

Unfortunately, prior portable computer systems that provide fixed power allocation to standardized card slots cannot efficiently manage electrical power as removable devices are inserted and removed from the system. Such a prior system may indicate that electrical power is not available for a newly inserted removable device even though the power states and operating modes of the other devices provide enough electrical current capacity. As a consequence, the ability of such a prior portable computer systems to adapt to the insertion and removal of removable devices is severely limited. Such a limited power management capability limits the utility and versatility of a portable computer system that provides such standardized card slot mechanisms.

SUMMARY AND OBJECTS OF THE INVENTION

One object of the present invention is to budget power for removable devices in a computer system.

Another object of the present invention is to allocate power to a removable device by determining the available power according to the power consumption of resident devices.

Another object of the present invention is to allocate power to a removable device by determining the available power according to the power consumption of other removable devices.

A further object of the present invention is determine the available power for allocation to a removable device according to the active and standby power status of the resident devices.

Another object of the present invention is to allocate power to a removable device by balancing the available power for the computer system against the performance level of the removable device.

These and other objects of the invention are provided by a computer system comprising a nonvolatile memory coupled to a system bus, wherein the nonvolatile memory contains a power resource table that stores a power consumption indication for at least one resident device for the computer system and that stores an indication of available power for the computer system. The computer system further comprises a socket controller coupled to the system bus. The socket controller receives a removable device that contains a card information structure that stores a power consumption indication for the removable device. The computer system further comprises a processor coupled to access the power consumption indication for each resident device from the power resource table and the power consumption indication for the removable device from the card information structure. The processor executes a power management driver that allocates a power budget to the removable device. The power management driver updates the power resource table to indicate the power budget to the removable device.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
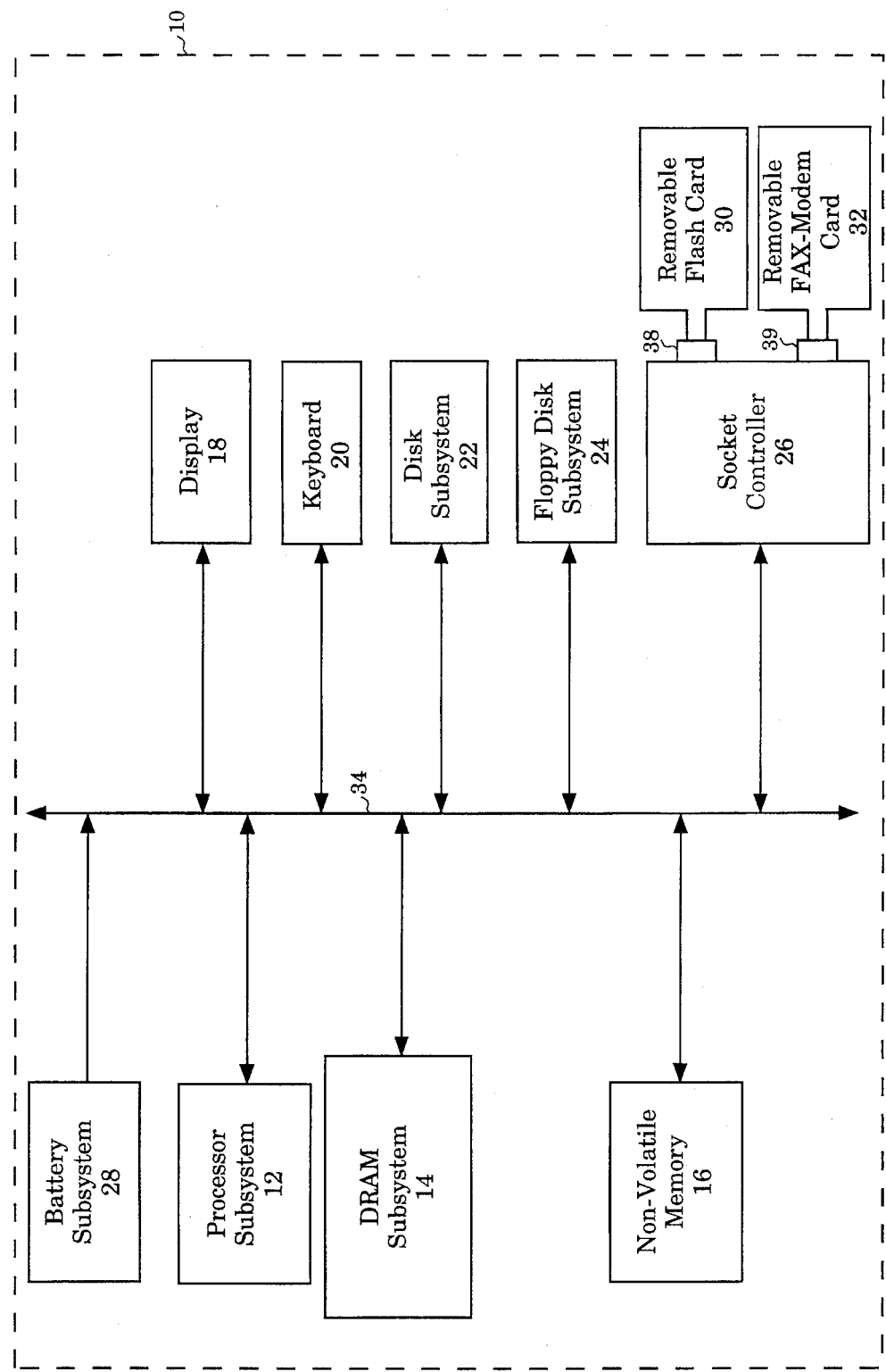
FIG. 1 illustrates a computer system for one embodiment which comprises a processor subsystem, a dynamic random access memory (DRAM) subsystem, a non-volatile memory, and a set of resident and removable devices.

FIG. 1 illustrates a computer system 10 for one embodiment. The computer system 10 comprises a processor subsystem 12, a dynamic random access memory (DRAM) subsystem 14, and a non-volatile memory 16. The computer system 10 further comprises a set of resident devices including a display 18, a keyboard 20, a disk subsystem 22, and a floppy disk subsystem 24.

The processor subsystem 12 communicates with the DRAM subsystem 14, the non-volatile memory 16, and the resident devices over a system bus 34. The DRAM subsystem 14 provides storage areas for an operating system, a set of application programs, and a set of device driver programs and associated software data structures implemented on the computer system 10.

The non-volatile memory 16 provides storage areas for a set of basic input/output software (BIOS) for the computer system 10. For one embodiment, the non-volatile memory 16 comprises a flash memory. For another embodiment, the non-volatile memory 16 comprises a static random access memory with battery power backup.

The display 18 provides display functions for the computer system 10. The display 18 provides user and software controllable intensity levels and display back-lighting functions. The amount of electrical power consumption of the display 18 varies according to the display intensity and the intensity of back-lighting. The computer system 10 implements a display driver program that tracks and controls the intensity and back-lighting levels for the display 18.

The disk subsystem 22 comprises a rotating media mass storage device. The electrical power consumption for the disk subsystem 22 varies according to an active operating mode and a standby mode. The disk subsystem 22 consumes maximum electrical power in the active operating mode and minimum power in the standby mode.

The computer system 10 further comprises a socket controller 26. The socket controller 26 enables random insertion and removal of removable devices for the computer system 10. The socket controller 26 provides a pair of sockets 38 and 39 for accepting removable cards. The socket controller 26 enables communication to the removable devices inserted into the sockets 38 and 39 over the system bus 34. The removable devices shown coupled to the computer system 10 comprise a removable flash card 30 and a removable fax-modem card 32.

For one embodiment, the socket controller 26 provides a physical form factor and an electrical interface for the sockets 38 and 39 that conforms to the personal computer memory card international association (PCMCIA) standard. The removable flash card 30 and the removable fax-modem card 32 each conform to the PCMCIA standard.

The system bus 34 comprises a set of address lines, a set of data line, and a set of control lines for communication among the devices and subsystems of the computer system 10. The system bus 34 also comprises a set of power lines that supply electrical current to the elements of the computer system 10.

The computer system 10 further comprises a battery subsystem 28 that supplies electrical power to the computer system 10 through the power lines of the system bus 34. For one embodiment, the battery subsystem 28 provides a logic-level power supply voltage (Vcc) and a flash programming level supply voltage (Vpp).

The socket controller 26 supplies power to the removable flash card 30 and the removable fax-modem card 32 through the sockets 38 and 39, respectively. For one embodiment, the power supplied to the removable flash card 30 includes a Icc electrical current from the Vcc voltage supply and an Ipp electrical current from the Vpp voltage supply over the power lines provided on the system bus 34.

Figure 2:
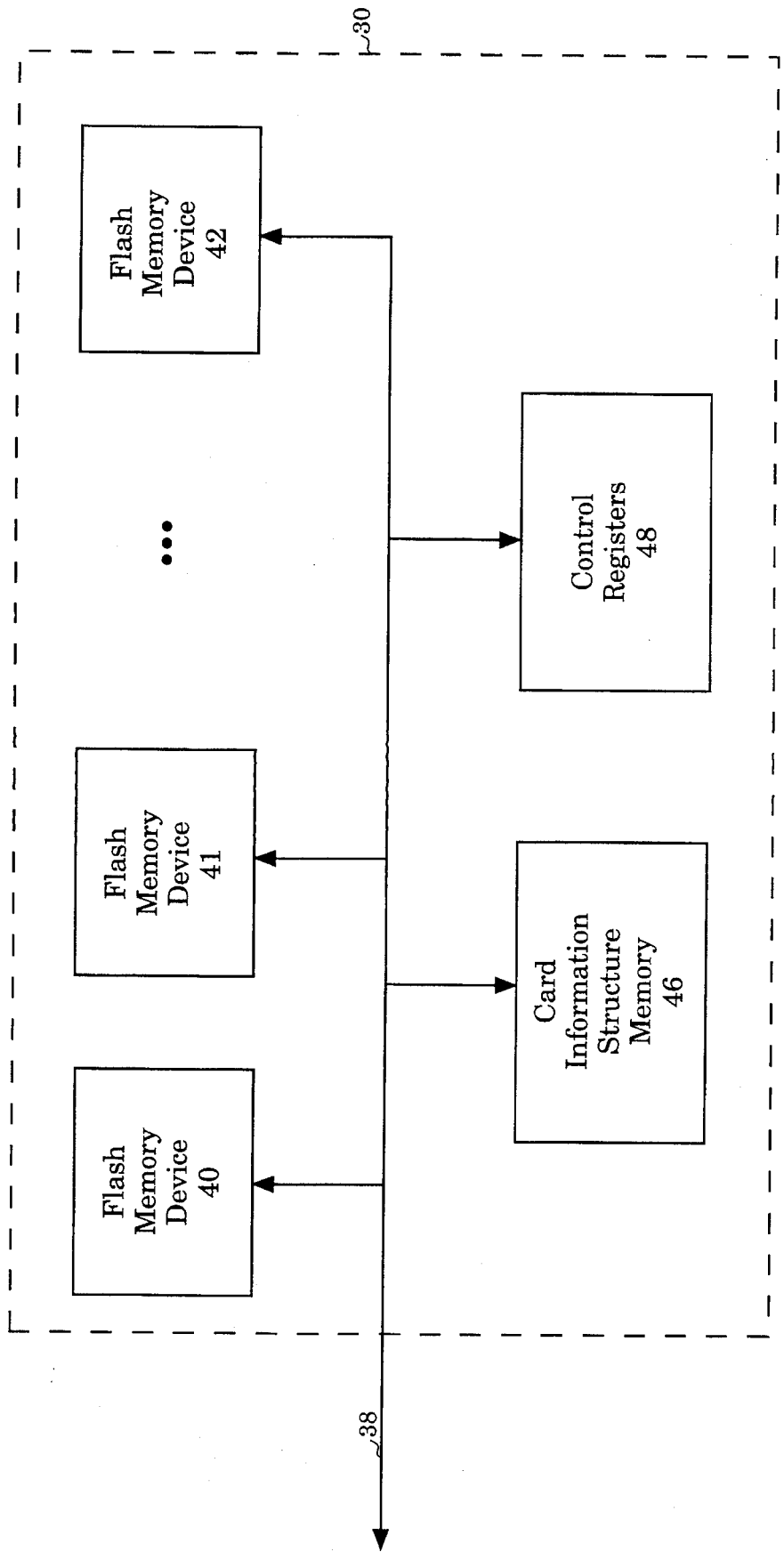
FIG. 2 illustrates a removable flash card for one embodiment which comprises a set of flash memory devices, a card information structure (CIS) memory, and a set of control registers.

FIG. 2 illustrates the removable flash card 30 for one embodiment. The removable flash card 30 comprises a set of flash memory devices 40–42, a card information structure (CIS) memory 46, and a set of control registers 48. The socket controller 26 communicates with the flash memory devices 40–42, the card information structure memory 46, and the control registers 48 via the signal lines of the socket 38.

The card information structure memory 46 is a non-volatile memory that stores power consumption information for the removable flash card 30. The power consumption information includes the peak power consumption of the removable flash card 30 in the active mode, and the power consumption of the removable flash card 30 in the standby mode. The power consumption information also indicates the power consumption each flash memory device 40–42 during flash program and erase operations.

The socket controller 26 enables the processor subsystem 12 to access the card information structure memory 46 and the control registers 48 over the system bus 34.

The Icc electrical current supplied via the system bus 34 powers the card information structure memory 46, the control registers 48 as well as read and control access functions to the flash memory devices 40–42. The Ipp electrical current supplied via the system bus 34 powers the program and erase operations in the flash memory devices 40–42.

The processor subsystem 12 performs program and erase operations on individual flash memory blocks in the flash memory devices 40–42 by transferring commands over the system bus 34 through the socket controller 26. Each of the flash memory devices 40–42 has the capability of independently performing an erase block operation or a program operation as specified by program and erase commands from the processor subsystem 12.

Each program or erase operation in the flash memory devices 40–42 draws Ipp electrical current over the system bus 34. The amount of Ipp electrical current drawn by the removable flash card 30 is proportional to the number of program and erase operations concurrently underway in the flash memory devices 40–42. A device driver program for the removable flash card 30 controls the electrical Ipp power consumption of the removable flash card 30 by controlling the number of overlapping program or erase operations initiated in each of the flash memory devices 40–42.

Figure 3:
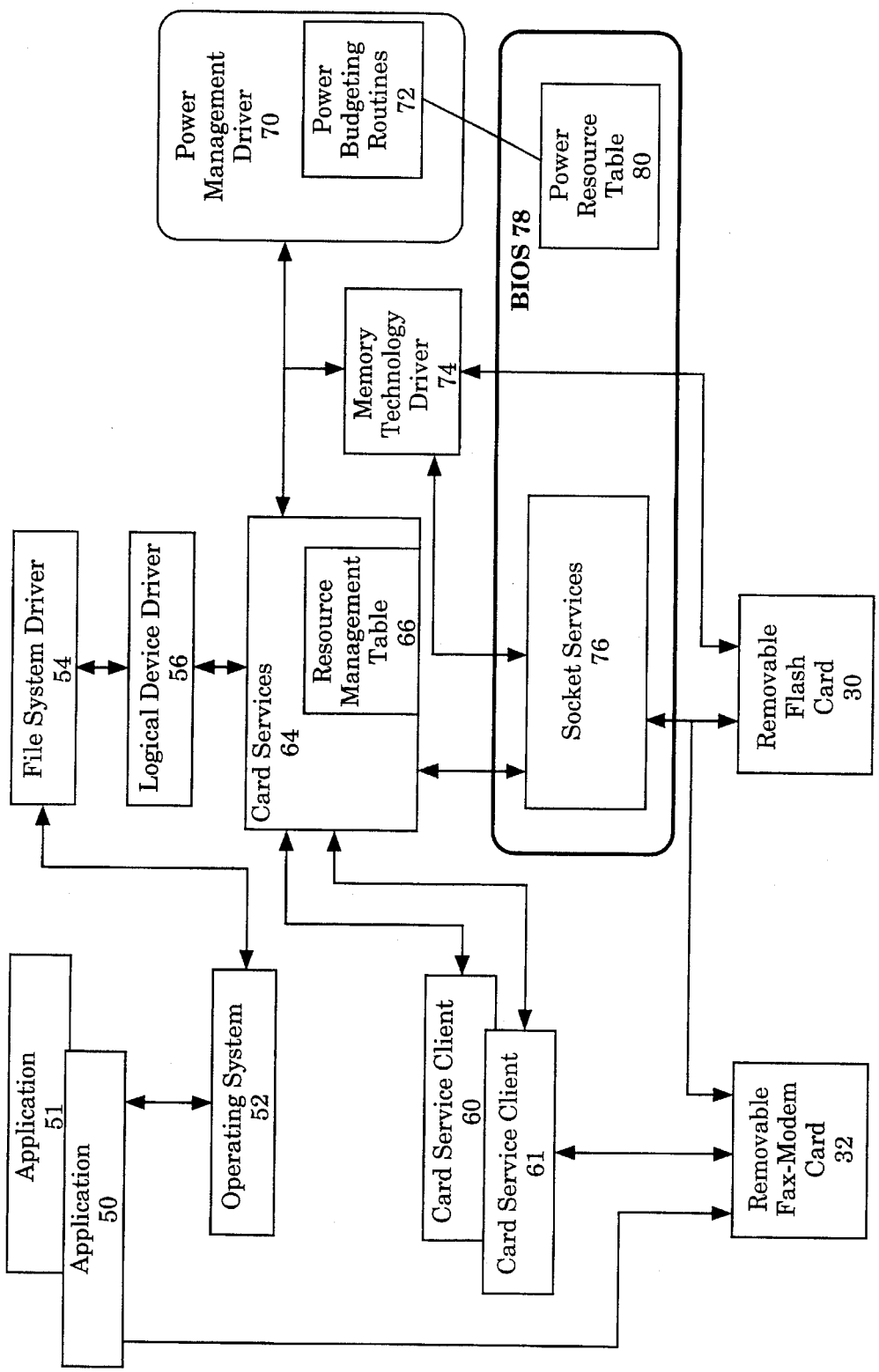
FIG. 3 illustrates the software architecture for the computer system for one embodiment which includes an operating system that supports a set of application programs and device driver and power management programs.

FIG. 3 illustrates the software architecture for the computer system 10 for one embodiment. The computer system 10 software includes an operating system 52 that supports a set of application programs including a pair of application programs 50 and 51, and that supports a set of device driver programs for the resident and removable devices of the computer system 10.

For one embodiment, the removable flash card 30 provides storage areas for a file system of the computer system 10. The file system maintained in the removable flash card 30 is managed by a file system driver 54. The file system driver 54 provides file access functions to the operating system 52 including open file, close file, and read and write file access functions.

A logical device driver 56 functions as a device driver program to the removable flash card 30 for the file system driver 54. The logical device driver 56 processes read, write, copy and erase commands from the file system driver 54. The logical device driver 56 notifies the file system driver 54 upon the insertion of the removable flash card 30 into the socket 38 and the removal of the removable flash card 30 from the socket 38. The logical device driver 56 communicates with the removable flash card 30 through a set of card services 64 functions and a set of socket services 76 functions.

The card services 64 provide a set of system functions that enable application programs and device driver programs on the computer system 10 to access the removable devices coupled to the sockets 38 and 39 of the socket controller 26. The card services 64 include functions that notify the device drivers upon insertion or removal of removable devices from the sockets 38 and 39.

The card services 64 maintains a resource management table 66 that specifies system memory allocation to the removable devices coupled to the sockets 38 and 39. The card services 64 also maintains the resource management table 66 to indicated the input/output address mapping for the removable devices coupled to the sockets 38 and 39.

A pair of card service clients 60 and 61 are device driver programs corresponding to the application programs 50 and 51, respectively. The card service clients 60 and 61 invoke the card services 64 to access the control registers and card information structure of the removable fax-modem card 32. Card service clients 60 and 61 also invoke the card services 64 to obtain system memory and I/O mapping for the removable fax-modem card 32. The card services 64 notifies the card service clients 60 and 61 upon insertion and upon removal by the user of the removable fax-modem card 32.

The card services 64 communicates with the removable devices coupled to the sockets 38 and 39 by invoking a set of socket services 76. The socket services 76 comprise a portion of the basic input/output software (BIOS) 78 of the computer system 10.

A memory technology driver 74 implements a set of software routines that provide control commands as well as erase and write algorithms for the flash memory devices 40–42 contained in the removable flash card 30. The memory technology driver 74 enables the card services 64 to perform the lead, write, copy and erase functions requested by the logical device driver 56.

The socket services 76 notifies the card services 64 and the memory technology driver 74 upon insertion or removal of the removable flash card 30. The socket services 76 also provide input/output functions that enable the memory technology driver 74 and the card services 64 to access the card information structure memory 46 and the control registers 48 on the removable flash card 30.

A power management driver 70 performs power budgeting functions for the computer system 10. The power management driver 70 implements a set of power budgeting routines 72. The power budgeting routines 72 access a power resource table 80 contained within the BIOS 78 and determine available electrical power for the computer system 10. The power management driver 70 processes power allocation request packets from the card services 64. The power allocation request packets indicate requests for power allocation by the logical device driver 56 for the removable flash card 30 and requests for power allocation by the card service clients 60 and 61 for the removable fax-modem card 32.

For one embodiment, the processor subsystem 12 conforms to the Intel microprocessor architecture. Device drivers on the computer system 10 invoke the card services 64 through a software interrupt 1A hex. In addition, the socket surfaces 76 are invoked by the software interrupt 1A hex. Each requested function for the card services 64 or the socket services 76 via the: software interrupt 1A hex is identified by a function number in the AH register. Other functional arguments for requests to the socket services 76 are passed through other internal registers of the processor subsystem 12. The arguments for a request to the card services 64 are passed through a data structure referred to as a request packet. Requests to the card services 64 provide a pointer to the corresponding request packet using the ES and BX register pair.

Table 1 illustrates the format of a request packet to the card services 64 for one embodiment. The function field for a request packet is a single byte that identifies the requested function of the card services 64.

TABLE 1

| Offset | Field | Size (Bytes) |
| --- | --- | --- |
| 0 | Length | 1 |
| 1 | Function | 1 |
| 2 | Function-Specific | Various (0 . . . x) |

The card services 64 implement a call back interface to the card service clients 60 and 61, the logical device driver 56, and the power management driver 70. The card service clients 60 and 61, the logical device driver 56 and the power management driver 70 are all clients of the card services 64. The call back interface of the card services 64 notifies the appropriate clients when the user inserts a removable device into one of the sockets 38 or 39.

A client registers for call back notification of such insertion events with a register_client function to the card services 64. After the register client function, the client is notified each time a removable device is inserted into one of the sockets 38 or 39. To notify a client, the card services 64 invokes a clients insertion call back handler upon an insertion event and passes a pointer to an insertion information structure.

Table 2 illustrates the insertion information structure for one embodiment. The insertion information structure provides card information structure (CIS) data from the corresponding removable device. For example, when the removable flash card 30 is inserted into one of the sockets 38 or 39, the insertion information structure provides data from the card information structure 46 on the removable flash card 30.

TABLE 2

| Field Name | Size | Source |
| --- | --- | --- |
| Socket Status | Byte | Bit-mapped field (set = true) Bit 0 In-use Bit 1 Exclusively used |
| First Device Type | Byte | From Device ID Tuple |
| Function Code | Byte | From Function ID Tuple |
| System Init Mask | Byte | From Function ID Tuple |
| Manufacturer Code | Word | From Manufacturer ID Tuple |
| Manufacturer Info | Word | From Manufacturer ID Tuple |

For one embodiment, the BIOS 78 is contained in the non-volatile memory 16 which is an up datable flash memory. The power resource table 80 of the BIOS 78 stores the power consumption information for the resident devices of the computer system 10. The power resource table information indicates the active, standby, and power down state electrical current consumption of the resident devices including the display 18, the keyboard 20, the disk subsystem 22, the floppy disk subsystem 24, the processor subsystem 12, the DRAM subsystem 14, and the non-volatile memory 16. The power resource table 80 also stores information on the supply capacity of the power supplies for the computer system 10 including the battery subsystem 28.

The power management driver 70 accesses the power resource table 80 and determines the available Icc and Ipp power by subtracting the electrical current consumption of the resident devices from the total available current from the power supplies as indicated in the power resource table. For one embodiment, the available electrical current from the power supplies indicated in the power resource table 80 is a fixed value determined by the type of power supply or the type of battery subsystem 28 for the computer system 10. For another embodiment, the power management driver 70 determines the total available electrical current from the battery subsystem 28 by a real-time calculation based upon the discharge characteristics of the battery subsystem 28.

For one embodiment, the Icc electrical current is supplied through a nominal five volt supply Vcc and the Ipp electrical current is supplied through a nominal twelve volt supply Vpp through independent regulator circuits. The real-time calculation of total available current accounts for the interaction of Ipp and Icc electrical current flow through the regulator circuits. In addition, the total available supply current is derated for particular types of batteries that vary supply current according to the charge level of the battery or the voltage level of the battery.

The power management driver 70 tracks the total available power from the battery subsystem 28 or other power supply for the computer system 10 such as an AC/DC adapter (not shown). The power management driver 70 tracks the total available electrical power as a resource. Each client device driver for the removable devices coupled into the slots 38 and 39 invokes the card services 64 to read the card information structure from the specified removable device. The card information structure provides information on the active, standby, and other power states of the removable device that indicates the power consumption of each state. For example, the logical device driver 56 invokes the card services 64 to read the card information structure memory 46. The information stored in the card information structure memory 46 indicates the active state and standby state electrical power consumption for the removable flash card 30.

The electrical power consumption of the removable flash card 30 varies according to the sequence of input/output operations initiated by the logical device driver 56 and the number of concurrent program or erase operations underway to the flash memory devices 40–42.

The file system driver 54 and the logical device driver 56 implement a command queue that specifies a queue size such that the queue size determines the number of simultaneous program or erase operations that may be overlapped in the flash memory devices 40–42. The higher the queue size, the greater the electrical power consumption of the removable flash card 30 and the faster the input/output operations to the removable flash card 30 can proceed. The more electrical power that the logical device drive 56 can obtain from the power management driver, the greater the throughput to the removable flash card 30.

For one embodiment, the card services 64 implements four basic power budgeting functions. Three of the power budgeting functions are client functions and one is a call back function by the card services 64. The client functions for power budgeting include a request_power function, a release_power function, and a get_power function.

The card service clients 60 and 61 and the logical device driver 56 use the request_power function to obtain a range of electrical power allocation from a minimum operating power to a maximum performance level of power as well as varying degrees of electrical power in between the minimum and the maximum. The card service clients 60 and 61 and the logical device driver 56 use the release_power function to release currently allocated power when the corresponding removable device is inactive or removed from the socket controller 26. The get_power function enables the card service clients 60 and 61 and a logical device driver 56 to inquire of the current power budget at any time.

A given removable device may consume sufficient levels of electrical current to prevent operation of another removable device located in an adjacent socket. For example, the removable fax-modem card 32 during active mode may draw sufficient current to block program or erase operations in the removable flash card 30. The card services 64 provides a reset_power call back function to notify clients of the card services 64 that power is being reset to a power budget of 0. The release_power call back causes the corresponding card service clients 60 and 61 and logical device driver 56 to force the corresponding budgeted power to 0. Thereafter, the card service clients 60 and 61 and the logical device driver 56 must re-acquire a power budget allocation using the request_power function of the card services 64. For the purposes of calculating the power budget, the card services 64 and the power management driver 70 calculate that a removable device that is reset by the reset_power function draws a standby amount of current according to the card information structure for the removable device.

Table 3 illustrates the format of a request packet for the request_power function to the card services 64 for one embodiment. Card services clients such as the card service clients 60 and 61 and a logical device driver 56 use the request_power function to request an Icc and Ipp electrical current and voltage allocation for the corresponding removable devices inserted in the sockets 38 and 39.

TABLE 3

| Offset | Field | Size | Type | Value | Detail/Description |
|---|---|---|---|---|---|
| 0 | Length | 1 | I | 0CH | Length of Request Packet |
| 1 | Function | 1 | I | xxH | Request Power Function |
| 2 | Socket | 2 | I | N | Logical Socket |
| 4 | Icc Request | 4 | I | N | Icc current @ Vcc voltage requested<br>Bits 31–16 Voltage (mv)<br>Bits 15–0 Budgeted Current (ua) |
| 8 | Ipp Request | 4 | I | N | Ipp current @ Vpp voltage requested<br>Bits 31–16 Voltage (mv)<br>Buts 15–0 Budgeted Current (ua) |

Table 4 illustrates the format of a request packet for a release_power function to the card services 64 for one embodiment. The release_power function releases a power allocation previously obtained by a corresponding request_power function. The release_power function sets the power allocation for the corresponding removable device to the default standby Icc and Ipp voltage and current levels as indicated by the corresponding card information structure of the removable device and the power resource table 80.

TABLE 4

| Offset | Field | Size | Type | Value | Detail/Description |
|---|---|---|---|---|---|
| 0 | Length | 1 | I | 0CH | Length of Request Packet |
| 1 | Function | 1 | I | xxH | Release Power Function |

Table 5 illustrates the request packet format for the get_power function for one embodiment. Card service clients such as the card service clients 60 and 61 and the logical device driver 56 use the get_power function to obtain an indication of the allocations of Icc and Ipp power that are in effect for the corresponding removable devices.

TABLE 5

| Offset | Field | Size | Type | Value | Detail/Description |
|---|---|---|---|---|---|
| 0 | Length | 1 | I | 0CH | Length of Request Packet |
| 1 | Function | 1 | I | xxH | Request Power Function |
| 2 | Socket | 2 | I | N | Logical Socket |
| 4 | Icc Status | 4 | O | N | Present Icc current @ Vcc voltage<br>Bits 31–16 Voltage (mv)<br>Bits 15–0 Budgeted Current (ua) |
| 8 | Ipp Status | 4 | O | N | Present Ipp current @ Vpp voltage<br>Bits 31–16 Voltage (mv)<br>Bits 15–0 Budgeted Current (ua) |

Table 6 illustrates the format of the reset_power information structure from the card services 64 for one embodiment. The card services 64 uses the reset_power call back to notify client device drivers for the corresponding removable device that the existing Icc and Ipp voltage and current allocations are being reset to default standby levels. The default standby levels are obtained from the removable devices corresponding card information structure.

For example, the default and standby Icc and Ipp voltage and electrical current levels for the removable flash card 30 are obtained by the card services 64 from the card information structure memory 46. The card services 64 maintains such information in a RAM based power resource table that is initialized by information from the power resource table 80. The card services clients generate new request_power calls to obtain new Icc and Ipp power allocations after a reset_power call back by the card services 64.

TABLE 6

| Field Name | Size | Source |
|---|---|---|
| Existing Icc | DWord | Icc in use, from Power Resource Table<br>Bits 31–16 Voltage (mv)<br>Bits 15–0 Budgeted Current (ua) |
| Existing Ipp | DWord | Ipp in use, from Power Resource Table<br>Bits 31–16 Voltage (mv)<br>Bits 15–0 Budgeted Current (ua) |
| Reset Ipp | DWord | Icc from Card's CIS Standby Requirements<br>Bits 31–16 Voltage (mv)<br>Bits 15–0 Budgeted Current (ua) |
| Reset Ipp | DWord | Ipp from Card's CIS Standby Requirements<br>Bits 31–16 Voltage (mv)<br>Bits 15–0 Budgeted Current (ua) |

For one embodiment, the card services 64 uses the power management driver 70 to maintain a RAM based power resource table in the DRAM subsystem 14. The RAM based power resource table indicates existing power allocations to the resident devices and removable devices of the computer system 10. The card services 64 initializes the RAM based power resource table with power information from the power resource table 80 of the BIOS 78.

The card services 64 updates the RAM based power resource table from the card information structures of the removable devices coupled to the socket controller 26. The card services 64 updates the RAM based power resource table each time a removable device is inserted or removed from one of the sockets 38 and 39. The card services 64 updates the RAM based power resource table according to the request_power and the release_power functions invoked by card services clients and according to the reset_power call back function. For another embodiment, the card services 64 directly updates the power resource table 80 in the non volatile memory 16.

Figure 4:
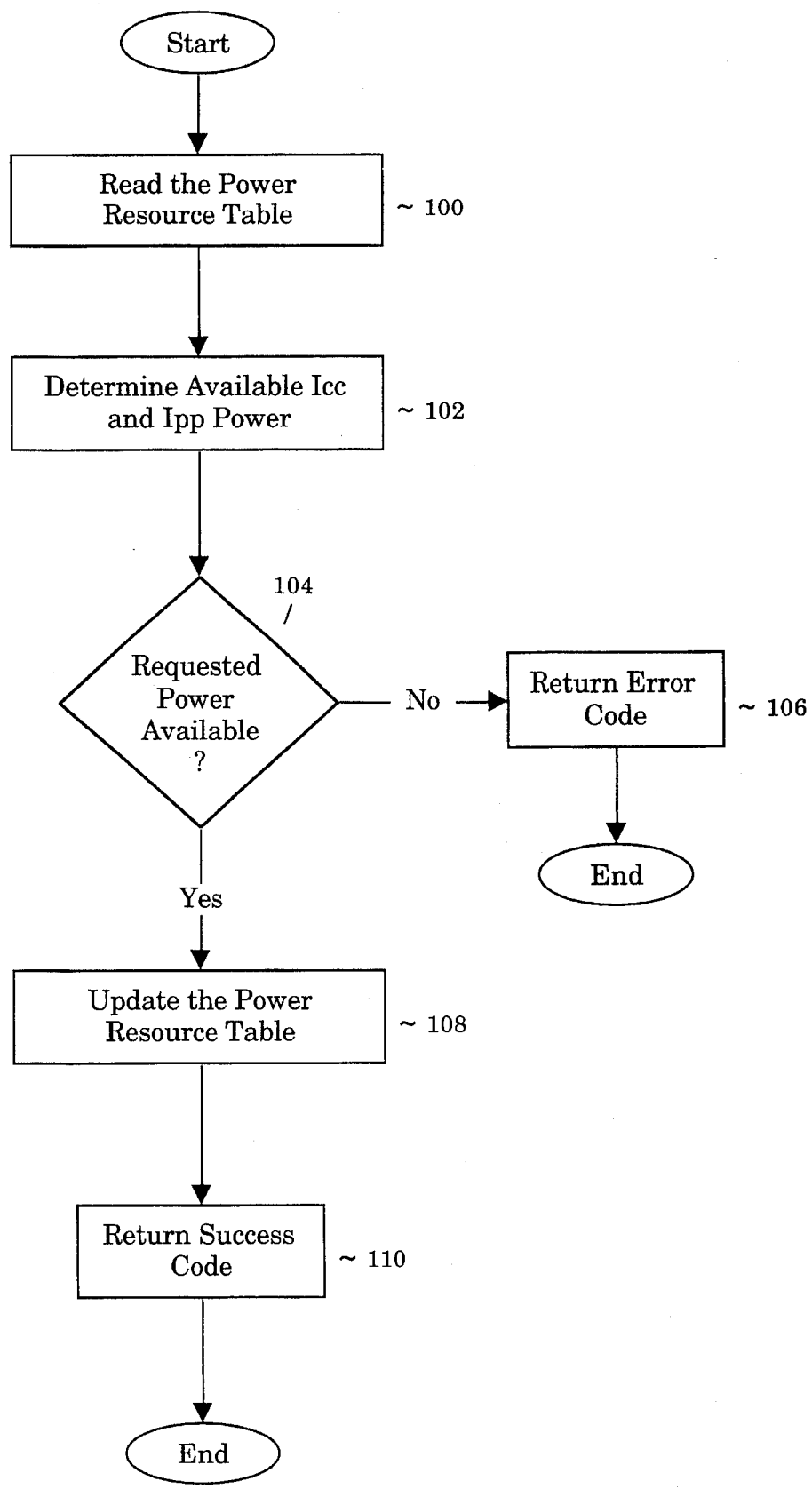
FIG. 4 shows a flow diagram that illustrates the processing of a request_power function by the card services for one embodiment.

FIG. 4 is a flow diagram that illustrates the processing of a request_power function by the card services 64 for one embodiment. The card services 64 begins processing a request_power function at block 100 by reading the RAM based power resource table to determine existing electrical power allocations. The RAM based power resource table also indicates available power from the battery subsystem 28. At block 102, the card services 64 determines available Icc and Ipp electrical power by subtracting the currently allocated power from the available Icc and Ipp power from the battery subsystem 28.

At decision block 104, the card services 64 determines whether the requested power allocations specified by the request packet of the request_power function is available according to the determination at block 102. If the requested power is not available, then the card services 64 returns an error code to the corresponding requesting card services client at block 106.

If the requested power is available at decision block 104, then the card services 64 updates the RAM based power resource table to reflect the new power allocation at block 108. Thereafter at block 110, the card services 64 returns a success code to the requesting card services client to indicate that the requested Icc and Ipp electrical power levels have been allocated.

Figure 5:
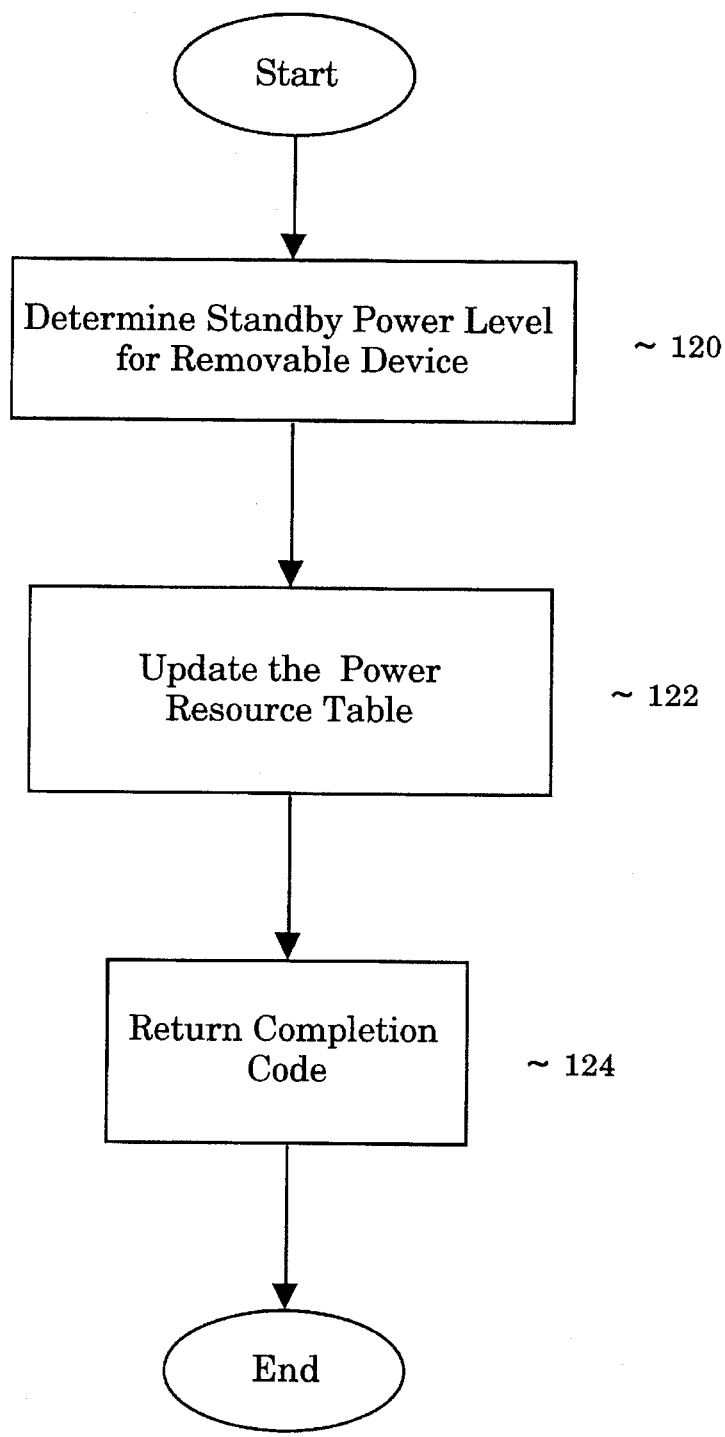
FIG. 5 illustrates the processing of a release_power function by the card services for one embodiment.

FIG. 5 illustrates the processing of a release_power function by the card services 64 for one embodiment. At block 120, the card services 64 determines the standby power level for the corresponding removable device of the requesting card services client device driver. The card services 64 determines the standby power levels for the removable device by accessing the RAM based power resource table which contains the standby power levels from the corresponding card information structure of the removable device.

Thereafter at block 122, the card services 64 updates the RAM based power resource table to indicate that the power allocation for the removable device is now at the standby levels. At block 124, the card services 64 returns a completion code to the corresponding client device driver.

Figure 6:
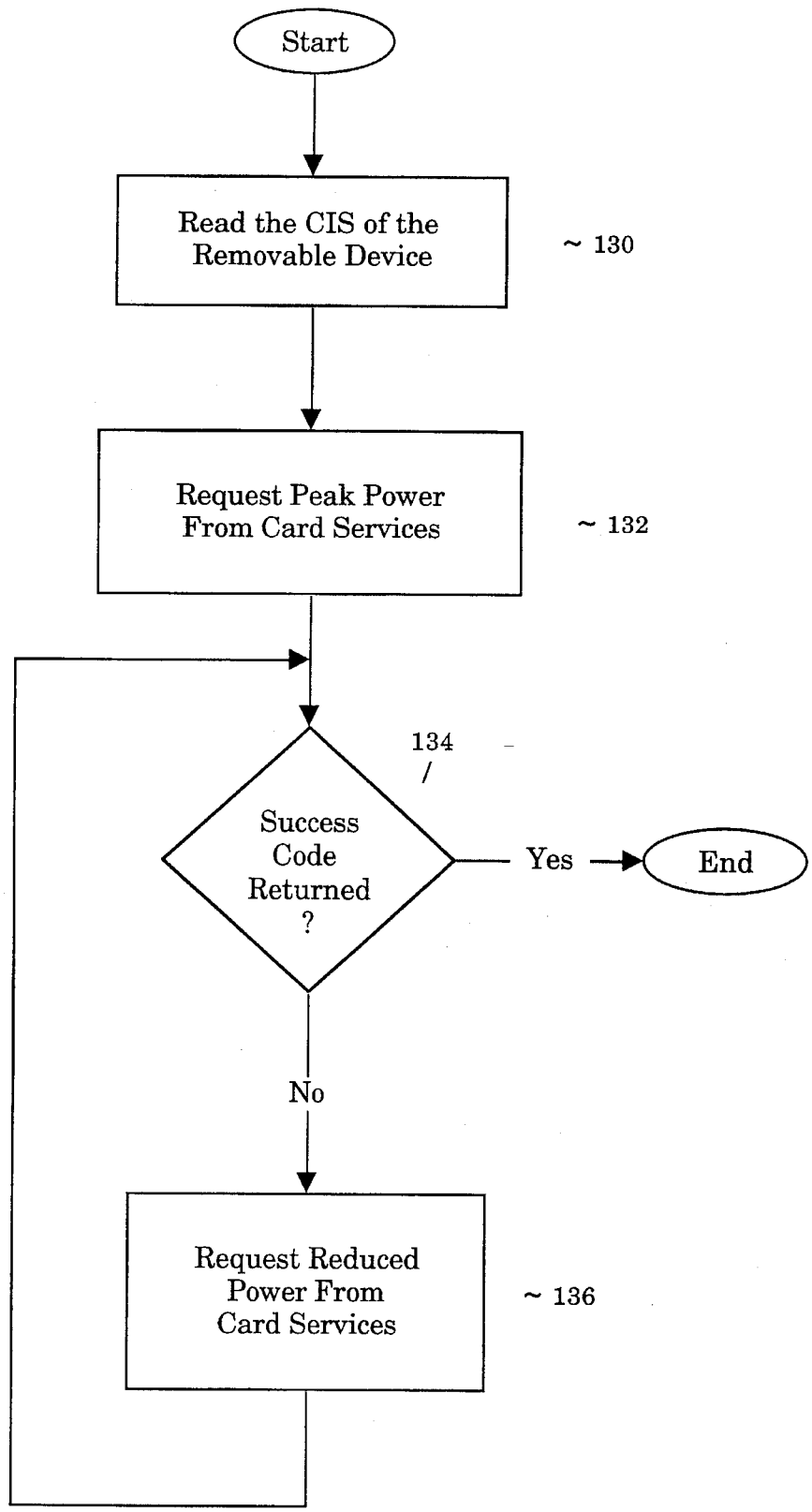
FIG. 6 illustrates the power allocation processing by a card service client device driver for one embodiment.

FIG. 6 illustrates the power allocation processing by a card service client device driver for one embodiment. Each card services client device driver such as the card service clients 60 and 61 and the logical device driver 56 perform power allocation after the card services 64 provides notification of the insertion of the corresponding removable device.

At block 130, the card services client device driver reads the card information structure (CIS) of the corresponding removable device. For example, the logical device driver 56 reads the card information structure memory 46 through the socket controller 26 over the system bus 34. The card information structure memory 46 indicates the peak and standby Icc and Ipp power levels for the removable flash card 30.

At block 132, the card services client device driver requests peak power from the card services 64 using the request_power function. At decision block 134, the card services client device driver determines whether a success code was returned from the card services 64 for the request_power function. If a success code is not returned at decision block 134, then the card services client device driver requests a reduce power allocation from the card services 64 using another request_power function at block 136. Thereafter at decision block 134, the card services client device driver checks for a success return code from the card services 64. The card services client device driver loops between blocks 134 and 136 in iteratively reduces the requested power allocation through the request_power functions until a success code is returned at decision block 134.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A computer system, comprising:

nonvolatile memory coupled to a system bus, the nonvolatile memory containing a power resource table that stores a power consumption indication for at least one resident device for the computer system;

socket controller coupled to the system bus, the socket controller for receiving a removable device, the removable device containing a card information structure that stores a power consumption indication for the removable device;

processor coupled to access the power consumption indication for each of said at least one resident device from the power resource table and the power consumption indication for the removable device from the card information structure, the processor coupled to fetch and execute a power management driver that allocates a power budget to the removable device.

2. The computer system of claim 1, wherein the power resource table stores an indication of available power from a power supply for the computer system.

3. The computer system of claim 1, wherein the power management driver updates the power resource table to indicate the power budget to the removable device.

4. The computer system of claim 1, wherein the processor is coupled to fetch and execute a device driver that requests the power budget from the power management driver.

5. The computer system of claim 4, wherein the device driver requests the power budget from the power management driver according to the power consumption indication for the removable device.

6. The computer system of claim 4, wherein the device driver reads the power consumption indication for the removable device and requests the power budget from the power management driver equal to the power consumption indication for the removable device.

7. The computer system of claim 4, wherein the device driver requests the power budget from the power management driver by invoking a request_power function provided by a set of card services for the computer system.

8. The computer system of claim 4, wherein the device driver releases the power budget for the removable device by invoking a release_power function provided by the card services for the computer system.

9. The computer system of claim 4, wherein the device driver reads the power budget for the removable device by invoking a get_power function provided by the card services for the computer system.

10. The computer system of claim 4, wherein the power management driver invokes a reset_power call back to the device driver provided by the card services for the computer system, the reset_power call back causing a reset of the power budget to a standby level.

11. The computer system of claim 4, wherein the power supply for the computer system comprises a battery.

12. The computer system of claim 11, wherein the power management driver determines the indication of available power from the power supply for the computer system based upon a real-time calculation of discharge characteristics of the battery.

13. The computer system of claim 12, wherein the battery comprises a Vpp regulator circuit that supplies an Ipp current and a Vcc regulator circuit that supplies an Icc current to the computer system.

14. The computer system of claim 13, wherein the real-time calculation of discharge characteristics of the battery accounts for an interaction between the Ipp current through the Vpp regulator circuit and the Icc current through the Vcc regulator circuit.

* * * * *

UNITED STATES PATENT AND TRADEMARK OFFICE
CERTIFICATE OF CORRECTION

PATENT NO.    : 5,532,945
DATED         : July 2, 1996
INVENTOR(S)   : Kurt B. Robinson It is certified that error appears in the above-identified patent and that said Letters Patent is hereby corrected as shown below:

ON THE TITLE PAGE:

In the Abstract at [57] at line 12 delete "power:" and insert --power--

In column 9 at line 15 delete "Buts 15-0" and insert --Bits 15-0--

In column 9 at line 31 delete "0CH" and insert --02H--

Signed and Sealed this

Twenty-ninth Day of October 1996

Attest:

BRUCE LEHMAN

Attesting Officer

Commissioner of Patents and Trademarks